United States Patent
Thorslund et al.

(10) Patent No.: US 10,943,849 B2
(45) Date of Patent: Mar. 9, 2021

(54) MICROFLUIDIC ARRAY

(71) Applicant: APR Technologies AB, Enköping (SE)

(72) Inventors: Robert Thorslund, Steningehöjden (SE); Are Björneklett, Västerås (SE); Peter Nilsson, Sundbyberg (SE)

(73) Assignee: APR Technologies AB

( * ) Notice: Subject to any disclaimer, the term of this patent is extended or adjusted under 35 U.S.C. 154(b) by 263 days.

(21) Appl. No.: 15/579,438

(22) PCT Filed: May 20, 2016

(86) PCT No.: PCT/SE2016/050465
§ 371 (c)(1),
(2) Date: Dec. 4, 2017

(87) PCT Pub. No.: WO2016/195570
PCT Pub. Date: Dec. 8, 2016

(65) Prior Publication Data
US 2018/0166360 A1 Jun. 14, 2018

(30) Foreign Application Priority Data
Jun. 3, 2015 (SE) ...................... 1550716

(51) Int. Cl.
*F04B 19/06* (2006.01)
*H01L 23/473* (2006.01)
(Continued)

(52) U.S. Cl.
CPC .......... *H01L 23/473* (2013.01); *F04B 19/006* (2013.01); *F04B 19/06* (2013.01);
(Continued)

(58) Field of Classification Search
CPC ...... F04B 43/043; F04B 19/06; F04B 19/006; H05K 7/20272; H05K 7/20254; H01L 23/473; H01L 23/467; F28F 13/16
See application file for complete search history.

(56) References Cited

U.S. PATENT DOCUMENTS

| 4,643,745 | A | * | 2/1987 | Sakakibara | ............... B03C 3/12 96/76 |
| 5,632,876 | A | * | 5/1997 | Zanzucchi | .......... B01F 13/0077 204/600 |

(Continued)

FOREIGN PATENT DOCUMENTS

| CN | 103839905 A | 6/2014 |
| JP | 2008295114 A | 12/2008 |
| WO | WO 9951069 A2 | 10/1999 |

OTHER PUBLICATIONS

Bologa et al., "Multistage Electrohydrodynamical Pump", 2000 Conference on Electrical Insulation and Dielectric Phenomena.

*Primary Examiner* — Peter J Bertheaud
*Assistant Examiner* — Dnyanesh G Kasture
(74) *Attorney, Agent, or Firm* — Condo Roccia Koptiw LLP (57) ABSTRACT

An array of flow units for controlling a flow of a fluid is disclosed. The flow units are arranged to have a lateral extension in a common lateral plane. A downstream side of a first flow unit is in fluid communication with an upstream side of a second flow unit to allow a flow of fluid to pass through the flow units. The flow units comprise first and second electrodes which are connectable to a voltage source. At least a portion of the first electrode has a maximum height in a direction parallel to the direction of the flow and a maximum gauge in a direction orthogonal to the direction of the flow, wherein the maximum height is larger than the maximum gauge to improve the pumping efficiency of the (Continued)

device. A method for controlling a fluid flow using the array is also disclosed.

20 Claims, 7 Drawing Sheets (51) Int. Cl.
    *H01L 23/467*     (2006.01)
    *F04B 19/00*     (2006.01)
    *H05K 7/20*     (2006.01)
    *F04B 43/04*     (2006.01)

(52) U.S. Cl.
    CPC .......... *F04B 43/043* (2013.01); *H01L 23/467* (2013.01); *H05K 7/20254* (2013.01); *H05K 7/20272* (2013.01)

(56) References Cited

U.S. PATENT DOCUMENTS

| | | | | |
|---|---|---|---|---|
| 5,686,789 A * | 11/1997 | Schoenbach | ............ | H01J 1/025 313/491 |
| 2003/0121644 A1 * | 7/2003 | Tonosaki | ............ | H01L 23/473 165/104.25 |
| 2004/0091392 A1 * | 5/2004 | McBride | ............ | G02B 6/12007 422/400 |
| 2004/0112568 A1 | 6/2004 | Liu et al. | | |
| 2004/0241004 A1 * | 12/2004 | Goodson | ............ | F04B 17/00 417/48 |
| 2006/0169441 A1 * | 8/2006 | Schlitz | ............ | F04B 17/00 165/121 |
| 2006/0231034 A1 * | 10/2006 | Goto | ............ | H01L 21/67103 118/725 |
| 2006/0289662 A1 | 12/2006 | Dessiatoun | | |
| 2008/0118370 A1 * | 5/2008 | Zoulkarneev | ............ | F04B 19/006 417/50 |
| 2008/0175720 A1 * | 7/2008 | Schlitz | ............ | F04D 33/00 417/48 |
| 2009/0308081 A1 | 12/2009 | Ouyang et al. | | |
| 2010/0052540 A1 * | 3/2010 | Jewell-Larsen | ............ | F28F 13/16 315/111.91 |
| 2010/0116460 A1 * | 5/2010 | Jewell-Larsen | ............ | F04B 19/006 165/47 |
| 2011/0116206 A1 * | 5/2011 | Kim | ............ | H01L 23/467 361/231 |
| 2015/0059749 A1 * | 3/2015 | Nitta | ............ | A61M 16/0051 128/204.18 |

* cited by examiner

MICROFLUIDIC ARRAY

CROSS REFERENCE TO RELATED APPLICATIONS

This application is the National Stage Entry under 35 U.S.C. § 371 of Patent Cooperation Treaty Application No. PCT/SE2016/050465, filed 20 May 2016 which claims the benefit of Sweden Patent Application No. 1550716-3, filed 3 Jun. 2015, the contents of which are hereby incorporated by reference in their entirety.

FIELD OF THE INVENTION

The invention disclosed herein relates to devices for transporting fluids. More precisely, it relates to an electro-hydrodynamic array of flow units for controlling a fluid flow, as well as methods for controlling such array.

BACKGROUND OF THE INVENTION

The performance of electronic systems is to a large extent limited by the available cooling techniques for keeping the electronics within an appropriate temperature range. Smaller electronic devices having improved performance are associated with increased heat dissipation over a relatively small area. In other words, there is a growing need for space and energy efficient cooling of electronic devices.

As an example, satellites, such as telecommunication satellites, are approaching the technology limits of existing on-board thermal management systems. The power dissipation of these satellites increases to meet the growing requirements for broadcasting, broadband multimedia and mobile communications services. Micro, nano, or 'cube' satellites, which require low-mass heat removal from electronic components (satellite on a chip) are likely to need more compact thermal management systems for maintaining a high performance.

Cooling is also a crucial factor in the design of other electronic devices having heat-generating components, such as power electronics, powerful processors, light emitting diodes (LEDs), radio frequency amplifiers, lasers etc.

Bologa et al., "Multistage electrohydrodynamical pump", proceedings of the 2000 *Conference on Electrical Insulation and Dielectric Phenomena*, discloses a multistage electrohydrodynamical (EHD) pump with latticed electrodes of parallel wires embedded in a metal ring. According to Bologa et al., a formation of ions in a working medium, comprising a dielectric liquid, occurs at the emitter electrode, whereas the ions recombine at the collector. The ions move under the influence of Coulomb forces, which ions thereby entrain a flow of the working medium.

Even though such EHD pump may be employed in various cooling applications, there is still a need for an improved device and method for controlling the flow of a fluid and for providing improved pumping efficiency.

SUMMARY OF THE INVENTION

It is an object of the present invention to control the flow of a fluid in such manner that the efficiency of the transportation of the fluid is improved. It is a particular object to improve the capacity of an EHD pump for dielectric fluids.

Accordingly, the invention provides an array of flow units and a control method with the features of the independent claims. The dependent claims define advantageous embodiments.

In a first aspect, an array of flow units is provided, wherein the flow units are arranged to have a lateral extension in a common lateral plane. Each flow unit is adapted to control a respective flow of a fluid in a direction intersecting the common lateral plane. Each flow unit comprises a first electrode and a second electrode, wherein the second electrode is offset from the first electrode in a downstream direction of the respective flow of the fluid and wherein the electrodes are connectable to a voltage source. The first electrode comprises bridges and joints forming a grid structure, which is arranged to allow the fluid to flow there through. At least a portion of at least one of the bridges has a maximum height in a direction parallel to the direction of the flow, and a maximum gauge in a direction orthogonal to the direction of the flow, wherein the maximum height is larger than the maximum gauge, preferably at least twice the maximum gauge. The maximum height may also be three, four, five, or six times the maximum gauge, or larger. The flow units are arranged in an array such that a downstream side of a first one of the flow units is in fluid communication with an upstream side of a second one of the flow units so as to allow a flow of fluid to pass through the first and second one of the flow units.

In a second aspect, a method for controlling the flow of a fluid through an array of flow units is provided. The method comprises providing an array of flow units according to the first aspect, providing a fluid contacting the first electrode of at least one of the flow units, and applying an electric potential difference between the first electrode and the second electrode of said flow unit.

By the term "direction of flow of the fluid" or "flow direction" should be understood the main direction of the resulting net flow of fluid passing through a flow unit during operation. The term may also be referred to as "intended direction of flow".

The term "array" may refer to any ordered arrangement of flow units, wherein a plurality of flow units e.g. may be distributed along a line or in a two-dimensional matrix. The array may extend in a lateral plane and be formed of flow units arranged side by side, or abreast, in said lateral plane.

The "upstream side" of a flow unit may also be referred to as a side or portion of the flow unit at which the fluid, during use, enters the flow unit. Hence, this side could be understood as an inlet side, inlet portion or inlet opening. The upstream side may in some examples correspond to a portion of the flow unit in which the first electrode is located. Accordingly, the "downstream side" of a flow unit may be referred to as a side or portion at which the fluid, during use, exits the flow unit. This side could hence be understood as an outlet side, outlet portion or outlet opening. Further, this side may in some examples correspond to a portion in which the second electrode is located.

The first electrode may also be referred to an "emitter" or "emitter electrode", whereas the second electrode may be referred to as "collector" or "collector electrode". During use, the emitter may be adapted to emit electrons into the fluid and/or to negatively charge matter, such as particles or impurities of the fluid, in a close proximity of the emitter.

By a grid it is understood any structure comprising bridges that are joined to each other so as to e.g. a grating, net, or honeycomb structure, etc. The bridges and the joints define open areas of the grid which admit a fluid flow. In one example, the grid may comprise flanges forming a heat sink. The flanges, which e.g. may be formed of sheet metal, may be arranged in a lamellar structure wherein their edge portions are joined to a peripheral frame of the grid. Further, it is understood that the grid may comprise several bridges having the above specified ratio between their height and gauge. As an example, the whole grid other than its peripheral portions may e.g. be formed of such bridges. In another example, most of or all of bridges of the grid may fulfil the maximum height/gauge relation.

Several advantages are associated with the invention. By arranging flow units in an array extending in a lateral plane, a relatively flat and/or thin pump may be achieved that may be advantageous over pumps comprising several, stacked stages. Arranging a plurality of flow units abreast instead of above each other in a stack allows for the total height to be reduced, thereby allowing for a pump that can be used in applications wherein space is limited. Further, a thinner and/or flatter pump may have a larger surface-to-volume ratio, which may facilitate cooling or dissipation through an outer surface of the pump.

Connecting a downstream side of a first flow unit with an upstream side of a second or neighbouring flow unit allows for the fluid to be pumped or accelerated in several steps, which may increase e.g. pumping efficiency, flow velocity, and volumetric flow rate of the array. This arrangement may be similar to an array of series connected or cascade connected flow units for enhancing, controlling or manipulating a flow of the fluid. Pressure, volumetric flow or velocity of the fluid flow may be increased at each, or at least some of, the flow units in the array.

The present invention further allows for a flow of fluid to be re-circulated through one or several flow units. In other words, a given amount of fluid may pass through a flow unit several times so as to, in each round, further increase e.g. pressure, volumetric flow rate or flow velocity. By re-circulating the fluid flow, the number of flow units of the array may hence be reduced.

The flow units of the array may be oriented in the same direction, i.e., such that the downstream side of each flow unit, respectively, faces in a same direction. In other words, the flow units are arranged abreast such that the direction of fluid flow is parallel for each flow unit. Such orientation may facilitate manufacturing and assembling of the array. Arranging all flow units in a same orientation, e.g. with the upstream side facing a first direction and the downstream side facing a second, possibly opposing, direction may also facilitate electrical connection of the flow units. In one example, this allows for all first electrodes to be electrically connected on a first side of the array and/or the second electrodes to be electrically connected on a second side of the array.

Alternatively, the array may comprise at least one flow unit pointing, or being oriented, in an opposite direction as compared to the other flow units of the array. This may facilitate or simplify the fluid communication between two oppositely arranged flow units, since the fluid flow may exit the first one of the flow units and enter the second one of the flow units at the same side of the array. Shifting or alternating the orientation of one or several of the fluid units may further reduce the size of the array, thereby allowing for a smaller and yet relatively efficient array.

By forming the first electrode of a grid of bridges that have a relatively large height in relation to their gauge, the grid may be relatively rigid in terms of its ability to carry loads in the height direction of the bridges, or the direction of the flow. Thereby, a relatively rigid electrode is enabled, which is less prone to bend or deform, especially in the direction of the flow, and hence the risk for e.g. short-circuiting of the flow unit may be reduced. Further, the relatively rigid and stable grid may still have a relatively large open area which may provide a relatively low flow resistance being met by the fluid passing through the grid. Further, the relatively high and narrow bridges may reduce the amount of material required for forming a relatively stable and rigid grid, which may reduce both weight and cost of the flow unit and hence the array. By using a relatively rigid grid, the need for additional support structures may be reduced and a relatively well defined and constant spacing between the first and second electrodes may be achieved. The spacing may e.g. be within the range of 10-2000 μm, and more preferably in the range of 50-1000 μm.

With their relatively large height, the bridges also provide a relatively large contact surface between the grid structure and the passing fluid, which may facilitate any interactions between the electrode and the fluid, such as e.g. diffusion of material and/or injection of ions or electrons.

The distance, or spacing, between the first and the second electrode of a flow unit may be varied so as to control the strength of the electric field being induced between the electrodes. Experiments have shown that a smaller gap, and thus a stronger induced electric field, may enable increased pump efficiency, or flow rate, as compared to devices having a larger gap and being supplied with the same electric power.

According to an embodiment, at least one of the bridges of the first electrode comprises a tapered portion forming an edge or tip that is directed towards the second electrode. The present embodiment is based on the insight that by providing the first electrode with beaked or pointed portions, the injection of electrons per unit area of the first electrode into the fluid may be improved. Increasing the emitting of electrons may enhance the electrohydrodynamic effect, increase the flow through the flow unit, and thus improve its pumping efficiency of the array. Further, increasing the electron emitting efficiency from the first electrode may advantageously allow for a reduction of the flow resistance through the grid, since the open area of the grid, i.e. the grid area through which the fluid may pass, may be reduced without necessarily reducing the injected current.

According to an embodiment, at least one of the bridges comprises a tapered portion forming an edge or tip directed away from the second electrode. In other words, the tapered portion is directed anti-parallel to the flow of the fluid, which advantageously may streamline the upstream portion of the grid so as to reduce the flow resistance and enhance the efficiency of the flow unit.

According to an embodiment, the second electrode comprises bridges and joints forming a grid structure that allows the fluid to flow through the second electrode. At least one of the bridges comprises a portion having a maximum height in a direction parallel to the direction of the flow and a maximum gauge in a direction orthogonal to the direction of the flow, wherein the maximum height is larger than the maximum gauge, preferably at least twice the maximum gauge. The present embodiment is associated with similar advantages and effects as described with reference to the structure of the grid of the first electrode.

According to an embodiment, the second electrode comprises a structured surface portion facing the first electrode. The structured surface portion may comprise micro- and/or nanostructures which may increase the area of the surface portion. The microstructures and/or nanostructures may for example include the geometrical form of hills, ridges, paraboloids, pillars, or trenches. Increasing surface area of the second electrode is advantageous in that it may improve the ability of collecting, or absorbing, electrons and hence improve the efficiency of the electrode. Further, by increasing the surface area by means of micro- and/or nanostructures, a relatively active surface area can be achieved on a relatively small surface portion. This advantageously allows for a relatively larger active surface area and a relatively lower flow resistance. A relatively larger active area may also increase the lifetime of the second electrode, since it may then be less sensitive to contaminants passivating the surface.

According to an embodiment, the second electrode comprises a concave surface portion facing the first electrode. A concave surface portion is advantageous in that it may provide an increased surface area as compared to a flat surface portion, thereby enhancing the ability to collect electrons, e.g., electrons emitted by the first electrode. The concave surface may e.g. conform to an arc of a circle, or a surface of a sphere or of a cylinder, having its centre or symmetry axis at an edge or tip of the first electrode. Thereby, a homogenous electric field may be achieved between the first electrode and the second electrode.

According to an embodiment, at least one of the bridges and/or joints of the second electrode comprises a channel, or a plurality of channels, adapted to allow the fluid to flow through said channel. By arranging a passage through the material of the grid, the flow may be increased and/or the fluid resistance reduced.

According to some embodiments, at least one of the flow units may comprise a first electrode having an open area that is smaller than an open area of the second electrode, or vice versa. The first (or second) electrode may e.g. comprise a sparser grid, i.e. a grid having a larger distance between its bridges/joints, than a grid of the second (or first) electrode. Further, the open area of the first electrode may be differently distributed as compared to the open area of the second electrode. In one example, the open area of the first (second) electrode may be distributed as a plurality of open regions or through-holes of a grid, whereas the open area of the second (first) electrode may be formed of a single through-hole in a plate extending in a plane intersecting the direction of the flow of the fluid. It will also be appreciated that the open area of the first and/or second electrode may be formed of a sum of open areas of through-holes having a particular distribution over the surface of the electrode, and that the particular distribution is chosen with respect to e.g. desired flow resistance properties and/or desired electrical properties, such as a desired electric field distribution or electric field strength between the first electrode and the second electrode.

According to an embodiment, a flow unit may comprise a support structure arranged to separate the second electrode from the first electrode in the direction of the flow. The support structure may e.g. be electrically non-conductive and have a well defined thickness so as to maintain a desired spacing between the first and second electrodes. The support structure may e.g. be formed as a grid or a spacer comprising e.g. ceramics or polymers, and the first and/or second electrode(s) may be connected to or arranged on the support structure by means of e.g. welding, gluing, soldering, brazing, glazing or sintering. The support structure may comprise an alignment structure adapted to align the first electrode with the second electrode, and/or to align or position the flow unit in the array. The alignment structure may e.g. comprise a protruding member and a receiving member, such as a depression or recess, wherein the protruding member is adapted to cooperate with a corresponding receiving member of another support structure, and vice versa. Thereby the assemblage and alignment of the electrodes and/or the flow unit may be facilitated.

According to further embodiments, at least one of the first electrode, the second electrode and the support structure comprises a deformation structure arranged to compensate for, or absorb, e.g. thermally induced stresses, particularly in a plane intersecting the direction of the fluid flow. The deformation structure may e.g. be formed by a bridge being curved in the plane orthogonal to the direction of the flow. As the bridge is exposed to stresses or torsional torques in the plane orthogonal to its height (i.e. the flow direction), the bridge may due to its relatively large height and small gauge tend to deform in that plane rather than in the flow or height direction. This advantageously allows for a flow unit that is less sensitive to thermally induced stresses and thermal expansion. Thereby a flow unit, and possibly array, having relatively well defined dimensions and a relatively reliable shape may be achieved. Furthermore, the deformation structure may allow materials having different coefficients of thermal expansion (CTE) to be combined. As an example, the first and/or the second electrodes may be formed of a material having a first CTE whereas the support structure, to which the first and/or the second electrodes may be attached, may have another CTE. In such case, a deformation structure may be provided in the electrodes and/or the support structure so as to enable any internal thermal stresses that may be caused by the difference in CTE to be absorbed by the deformation structure being deformed in the plane orthogonal to the direction of the fluid flow. Thus, the deformation structure may enable a more reliable flow unit having a prolonged life.

According to an embodiment, the first electrode and/or the second electrode and/or the support structure is formed of a material that is selectively deposited so as to form the desired structure. The material may e.g. comprise a stacked structure of one or several metals. The depositing method may e.g. comprise molding, plating, screen printing, glazing, sputtering, evaporation or sintering.

Alternatively, or additionally, the manufacturing may comprise removal of material, e.g. by selectively removing material from a substrate. Examples of suitable techniques may include cutting, milling, etching, and abrasive blasting.

It will be further appreciated that the first electrode and/or the second electrode may be formed as a lamellar structure of flanges oriented in the direction of the flow and adapted to allow the fluid to flow through the electrode. The flanges may e.g. be formed from a planar sheet of an electrically conducting, and possibly heat conducting, material such as copper, which may be bent to form a lamellar structure.

The first and/or second electrodes may advantageously comprise a material that has a relatively good ability of emitting electrons and is chemically stable, or inert, in relation to the pumped fluid. Further, the material may have a relatively high temperature resistance. Examples of such materials may include e.g. Pt, Au, and stainless steel.

According to an embodiment, the applied electric potential difference between the first and the second electrodes of a flow unit of the array may be varied as a function of time. Experiments have shown that by e.g. alternating the potential difference between a first, positive value and zero, and/or between a positive and a negative value, the fluid flow per unit area, and hence the pump efficiency, may be improved.

Examples of fluids, i.e. liquids and gases, that can be pumped by means of embodiments of the inventions includes e.g. dielectrics such as acetone, alcohols, helium, nitrogen, carbon dioxide, air, and fluorocarbon-based fluids such as e.g. Fluorinert™ or Novec™.

In the present specification, the term "pump" or "pump assembly" may include any device capable of creating a movement, current or flow of a fluid within and/or through the device. The term may also be understood as a fan or fan assembly, in particular in case the fluid comprises a gaseous material.

Further objectives of, features of and advantages with the present invention will become apparent when studying the following detailed disclosure, the drawings and the appended claims. Those skilled in the art realise that different features of the present invention, even if recited in different claims, can be combined into embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which:

FIGS. 6a and b illustrate a flow unit according to an embodiment;

All the figures are schematic, generally not to scale, and generally only show parts which are necessary in order to elucidate the invention, whereas other parts may be omitted or merely suggested.

DETAILED DESCRIPTION OF EMBODIMENTS

Figure 1:
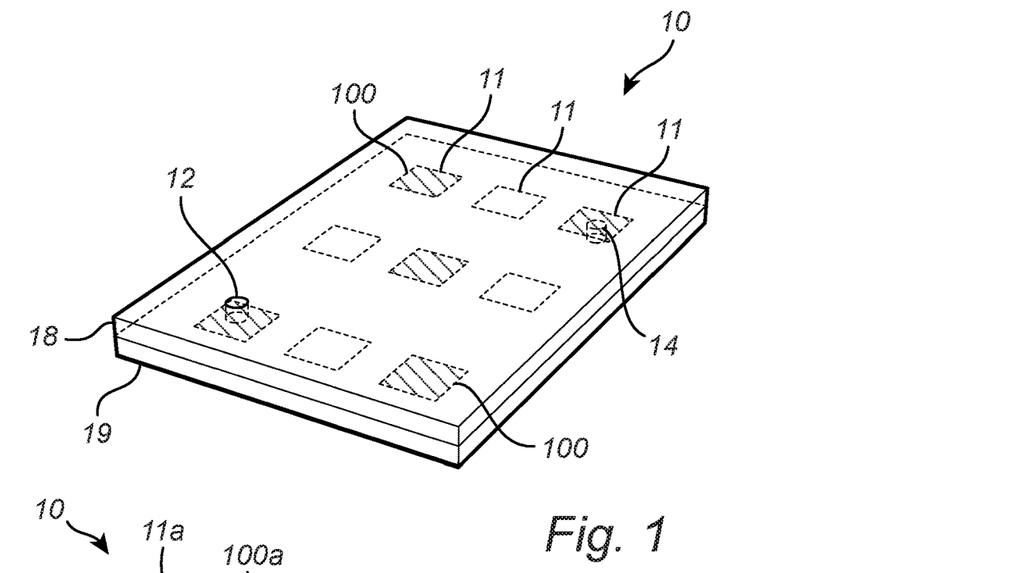
FIG. 1 is a schematic perspective view of an array of flow units according to an embodiment of the invention.

FIG. 1 shows an array 10, or pump assembly, comprising a plurality of flow units 100. The flow units 100 may be arranged in a cell structure comprising a lid part 18 and a bottom part 19. In FIG. 1, the outline of each cell 11 of the cell structure is indicated by a dashed line, whereas a cell 11 comprising a flow unit 100 is indicated by diagonal cross-hatching. The array 10 may comprise a first opening 12 for supply of fluid to the array 10. The first opening 12 may e.g. be arranged in the lid part 18. Further, a second opening 14 for outputting the fluid may be arranged in the bottom part 19 (indicated by a dashed line). According to the present embodiment, the array 10 may comprise e.g. five flow units 100 arranged in every second cell 11 of the cell structure. The flow units 100 may be arranged in a same direction or orientation such that the direction of flow of the fluid is essentially parallel for each one of the flow units 100. The cells 11 may be in fluid communication with one or several other cells 11 so as to allow a fluid to flow between the cells, preferably from one cell 11 to a neighbouring cell 11. During operation, a fluid may enter the cell structure via the first opening 12 and pass through a first flow unit 100 to a second flow unit 100 via neighbouring or intermediate cell 11.

Figure 2:
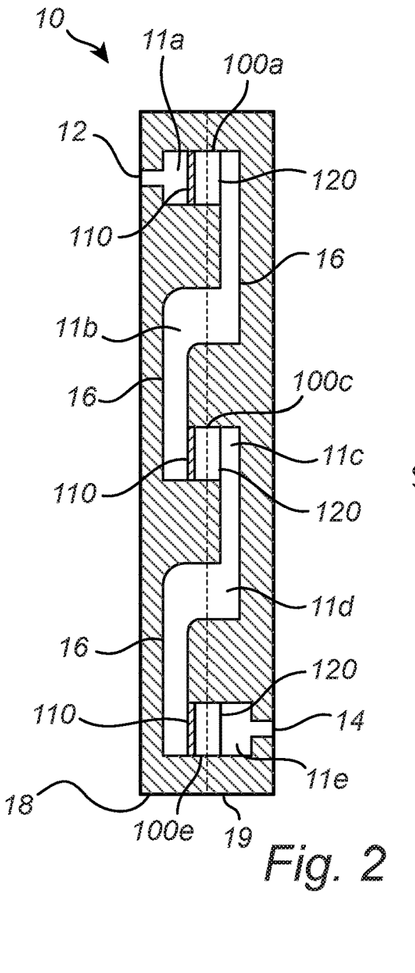
FIG. 2 shows a cross sectional portion of an array according to an embodiment of the invention.

FIG. 2 is a cross sectional side view of an array 10 that is similarly configured as the array 10 of FIG. 1. The array 10 of flow units 100a, 100c, 100e is arranged in cells 11a, 11c, 11e defined by a lid part 18 and a bottom part 19 comprising cell separating walls 17. The cells 11a, 11b, 11c, 11d, 11e are connected to each other by means of channels 16 adapted to let a flow of fluid pass from a downstream side D of a flow unit 100a, via an empty cell 11b, to an upstream side U of a neighbouring flow unit 100c. Each flow unit 100a, 100c, 100e comprise a first electrode 110, such as e.g. a grid shaped emitter, and a second electrode 120, such as e.g. a metal plate provided with a through-hole.

During operation, fluid may be entered through a first opening 12 and brought in fluid contact with the first electrode 110 of the flow cell 100a arranged in cell 11a. The fluid may be brought to flow by means of an electric field induced between the first electrode 110 and the second electrode 120, and continue through the channel 16 and the neighbouring, empty cell 11b to the next flow unit 100c. This process is repeated until the fluid reaches the second opening 14, through which it may exit the array 10.

As indicated in FIGS. 1 and 2, the flow units 100 may be oriented in the same direction, allowing the fluid to pass through each flow unit 100 in the same flow direction. Such arrangement of the flow units 100 may require a channel 16 and, according to the present example, an intermediate empty cell 11b, 11d for "reversing" the flow exiting at the downstream side D of a first flow unit 100 before it can enter at the upstream side U of a second flow unit 12.

Figure 3:
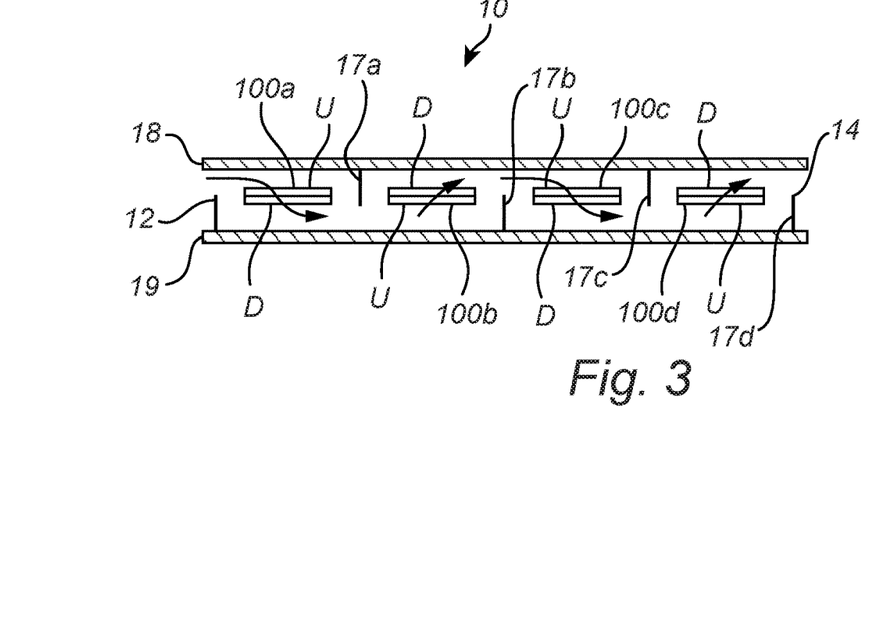
FIG. 3 is a cross section according to yet an embodiment.

However, as shown in FIG. 3, the array described with reference to FIGS. 1 and 2 may comprise flow units 100 that are arranged in opposing directions. FIG. 3 is a schematic illustration of such principle, wherein a first flow unit 100a is arranged with its upstream side U facing in a first direction (i.e. upwards in FIG. 3) and a second flow unit 100b is arranged with its upstream side U facing a second direction (i.e. downwards in FIG. 3). As the fluid enters the first cell 11a, it flows downwards through the first flow unit 100a, passes under the first cell separating wall 17b into the second cell 11b, continues upwards through the second flow unit 100b, over the second cell separating 17b wall and into the third cell 11c (the fluid flow indicated by arrows). This process is repeated for the third flow unit 100c, the third cell separating wall 17c, the fourth cell 11d and the fourth flow unit 100d until the fluid eventually exits through opening 14. As illustrated in FIG. 3, the array 10 may be adapted to let a flow enter and/or exit in a plane parallel to lateral plane of extension of the array 10.

Figure 4:
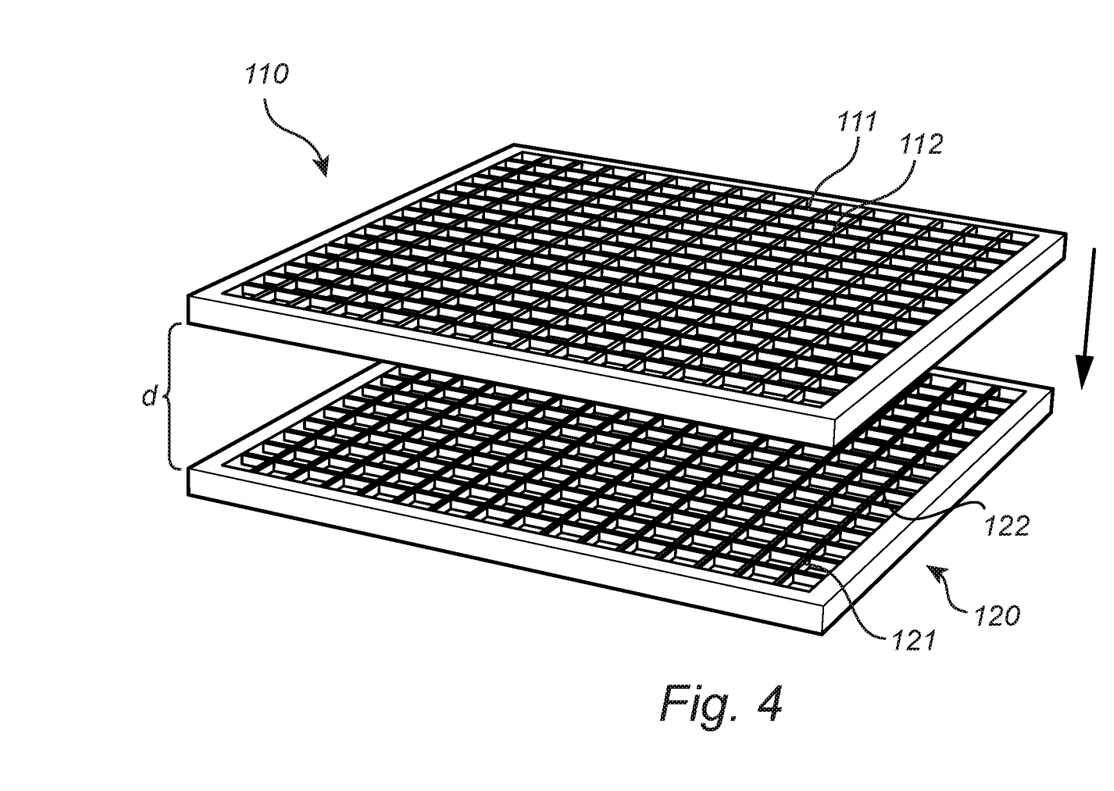
FIG. 4 is a schematic perspective view of a first and a second electrode of a flow unit according to an embodiment.

FIG. 4 shows an example of a flow unit 100 according to embodiments similar to the embodiments of FIGS. 1 to 3. The flow unit 100 may comprise a first electrode, or emitter 110, comprising bridges 111 and joints 112 forming a grid that allows a fluid to flow through the emitter 110. The emitter 110 may have a lateral extension in a plane perpendicular to the intended flow direction, which is indicated by an arrow in FIG. 4. According to this embodiment, the second electrode, or collector 120, comprises bridges 121 and joints 122 that are arranged in a similar grid the one described with reference to the emitter 110. Consequently, the collector 120 may have a lateral extension in a plane perpendicular to the direction of the flow such that both the emitter 110 and the collector 120 are parallel to each other.

The emitter 110 and the collector 120 may be arranged spaced apart from each other in the flow direction by a positive distance d. The spacing may e.g. be maintained by a support arrangement, or grid spacer 130 (not shown in FIG. 1) being arranged between the emitter 110 and the collector 120. A relatively narrow gap d may be desirable since such gap may provide a relatively high electric field and thus enhance the electrohydrodynamic effect affecting the flow rate. The use of a grid spacer 130, which may have a well defined thickness, may advantageously reduce the risk of a shortcut or breakdown between the emitter 110 and the collector 120. As will be discussed in more detail below, the grid spacer 130 may e.g. have a similar configuration as the emitter 110 and/or the collector 120, i.e. comprising a grid of bridges 111, 121 and joints 112, 122. The grid spacer 130 may however have other configurations as well, such as e.g. being formed as a frame supporting the lateral edges of the emitter 110 and/or collector 120.

It will also be realised that the grid may have one of a broad variety of shapes, wherein the edges and the joints e.g. may form a grating, a net, a hole pattern, a honeycomb structure, or other structures or patterns suitable for admitting a flow through the emitter 110 and/or collector 120.

FIG. 5 shows a cross section of a portion of the emitter 110 and collector 120 of a flow unit similarly configured as the flow units described with reference to any one of the previous figures. The cross section is taken through three pairs of the bridges 111, 121 and along a plane parallel to the flow direction. According to this embodiment, the bridges 111 of the emitter 110 is arranged at a constant distance d from the bridges 121 of the collector 120, wherein the bridges 111 of the emitter have a maximum height $h_1$ in the flow direction and a maximum gauge $w_1$ in a direction orthogonal to the flow direction. As shown in FIG. 2, the maximum height $h_1$ is greater than the maximum gauge $w_1$ so as to enable a relatively stable and rigid grid structure that can carry a relatively large load in the flow direction without a risk of deforming or collapsing, and yet have a relatively large open area allowing the fluid flow. According to this embodiment, the collector 120 may have a similar relationship between the maximum height $h_2$ and the maximum gauge $w_2$ of the bridges 121. The ratio between the maximum height $h_1$, $h_2$ and the maximum gauge $w_1$, $w_2$ may e.g. be larger than 1, and more preferably larger than 2.

Figure 5A:
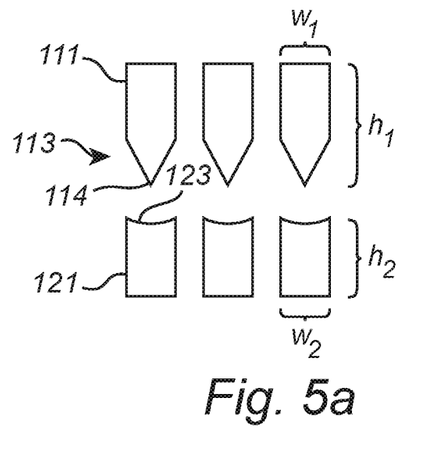
FIGS. 5a to d show cross sectional portions of the first and second electrode of a flow unit according to an embodiment.

The cross section of the bridges 111 of the emitter 110 may comprise a downstream portion 113 having a tapered shape forming an edge or a point 114 facing the collector 120. The tapered shape may e.g. be manifested as an edge or narrow end 114 extending along the downstream portion 113 of the bridge 111, or one or several protrusions having a shape conforming to e.g. a tip, needle, pyramid, dome, etc. As the emitter 110 is subjected to an electric potential difference, there may be an electric field concentration at the edge 114 of the tapered portion 113 which may facilitate or promote emission of electrons.

Correspondingly, the portion of the bridges 121 of the collector 120 which face the emitter 110 may be provided with a dedicated shape or surface structure for enhancing collection of the emitted electrons. The bridges 121 and/or joints 122 of the collector 120 may e.g. be provided with a concave surface portion 123 increasing the surface area, and/or a structured surface comprising microscopic protrusions and/or recesses 124 increasing the active surface area. The structures 124 may e.g. be formed by molding, electroplating, surface treatment or by selectively adding and/or removing material by e.g. abrasive blasting, etching, milling, grinding, etc.

FIG. 5a shows an example embodiment wherein the emitter 110 and the collector 120 are formed by screen printed Pt paste which has been sintered at about 800° C. so as to form a grid of bridges having a maximum height $h_1$, $h_2$ of about 100-200 µm and a maximum gauge $w_1$, $w_2$ of about 50 µm. As shown in FIG. 2b, the collector 120 has been equipped with a micro-structured surface portion 124, facing the emitter 110, by means of micro-blasting, wherein the surface is bombarded with sharp, micrometer-sized particles so as to increase the area of the surface.

Figure 5B:
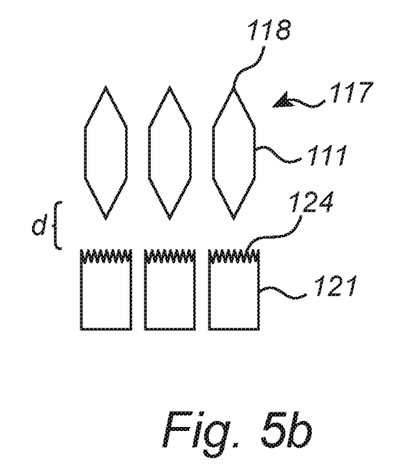
Figure 5C:
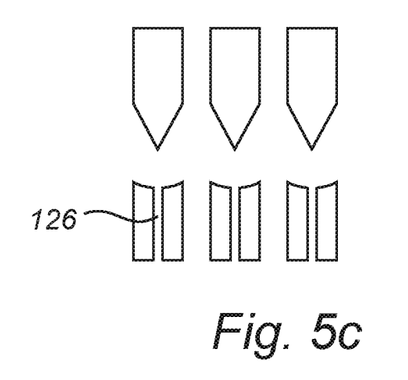
Figure 5D:
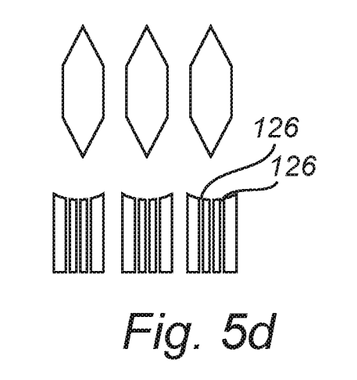

The flow units 100 in FIGS. 5b-d are similar to the flow unit 100 described with reference to FIG. 5a. According to FIG. 5b, the emitter 110 is further provided with a tapered upstream portion 117, forming a relatively sharp edge 118 directed towards the fluid flow so as to reduce the flow resistance and hence enhance the flow through the emitter 110. As indicated in FIGS. 5c and d, the collector 120 may further define channels 126 extending through the bridges 121 and/or the joints 122 (not shown) of the grid in order to decrease the flow resistance. The channels 126 may e.g. be effected by etching, such as e.g. reactive ion etching, wet etching, etc.

Figures 6A, 6B:
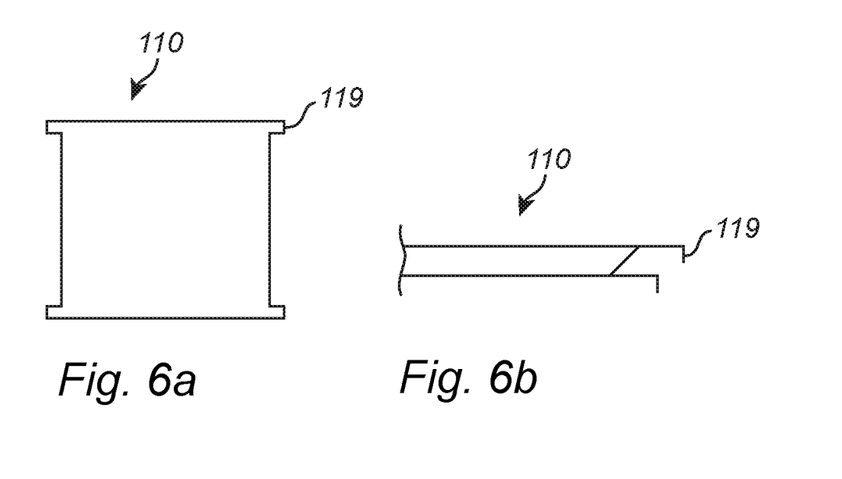

FIG. 6a is a top view indicating the outline or contour of a first or second electrode, such as e.g. an emitter 110. As shown in FIG. 6a, the emitter 110 may comprise alignments structures 119, which also can be used as electric contact portions for enabling electric connection of the emitter 110. The electric contact portions 119 may e.g. comprise protrusions which are integrally formed with the emitter 110, and which may be adapted to engage with a corresponding structure of e.g. a support structure 130 and/or stacking structure 140 (not shown in FIG. 6a).

In FIG. 6b, a perspective view of a portion of an emitter 110 is shown, the emitter 110 being similar to the emitter 110 described with reference to FIG. 6a. According to FIG. 6b, the alignment structure 119 is bent to form a contact portion enabling electric connection of the emitter.

Even though the embodiments described with reference to FIGS. 6a and b relates to an emitter 110, it will be appreciated that the same features and advantages e.g. may apply to a collector 120.

Figure 7A:
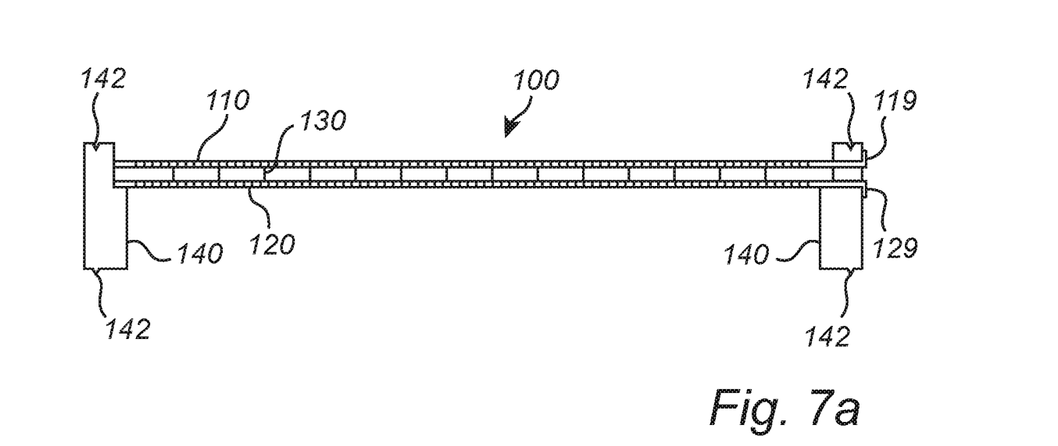
FIGS. 7a and b show a cross section according to an embodiment.

FIG. 7a is a cross section of a flow unit according to an embodiment of the invention. The flow unit may be similarly configured as the flow units described with reference to FIGS. 1 to 6, and may comprise a first electrode, or emitter 110, and a second electrode, or collector 120, which are arranged in a stacking structure 140. The emitter 110 and the collector 120 has a lateral extension in a plane perpendicular to the direction of the fluid flow, and are arranged spaced apart from each other by a support structure, or grid spacer 130. According to FIG. 7a, the emitter 110 and the collector 120 comprises a respective contact portion 119, 129 arranged at one of the sides of the flow unit. The respective contact portions 119, 129 may formed as integrally formed protrusions of the electrodes and be adapted to engage with an edge of the stacking structure. The protruding contact portions 119, 129 may hence act as alignment structures during assemblage of the flow units. and/or enable electric contacting of the electrodes 110, 120.

The stacking structure 140 may comprise alignment structures 142 for facilitating alignment of the stacked flow units 100. The alignment structures 142 of the stacking structure may 140 e.g. comprise a protruding portion that is adapted to fit into a recess of a corresponding alignment structure of a cell structure or bottom part. Correspondingly, the alignment structure 140 may comprise a recess adapted to receive a protruding portion of an alignment structure of a lid part.

Figure 7B:
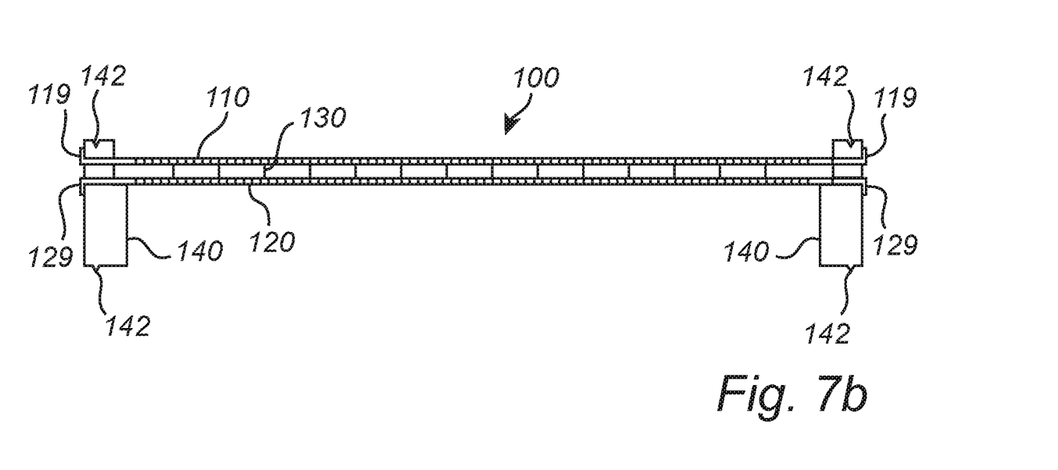

FIG. 7b shows a similar flow unit 100 as the one described with reference to FIG. 7a, wherein the emitter 110 and the collector 120 each have contacts portions 119, 129 arranged at both sides of the flow unit. According to other embodiments, the contact portions 119, 129 may also be arranged such that the contact portions 119 of the emitter 110 are arranged at a side opposite to the side at which the contact portions 129 of the collector 120 are arranged. This advantageously allows the emitters 110 and collectors 120 to be electrically contacted at separate sides of the flow unit 100, which may facilitate assemblage and handling of the flow units 100 and/or the array 10.

Figure 8A:
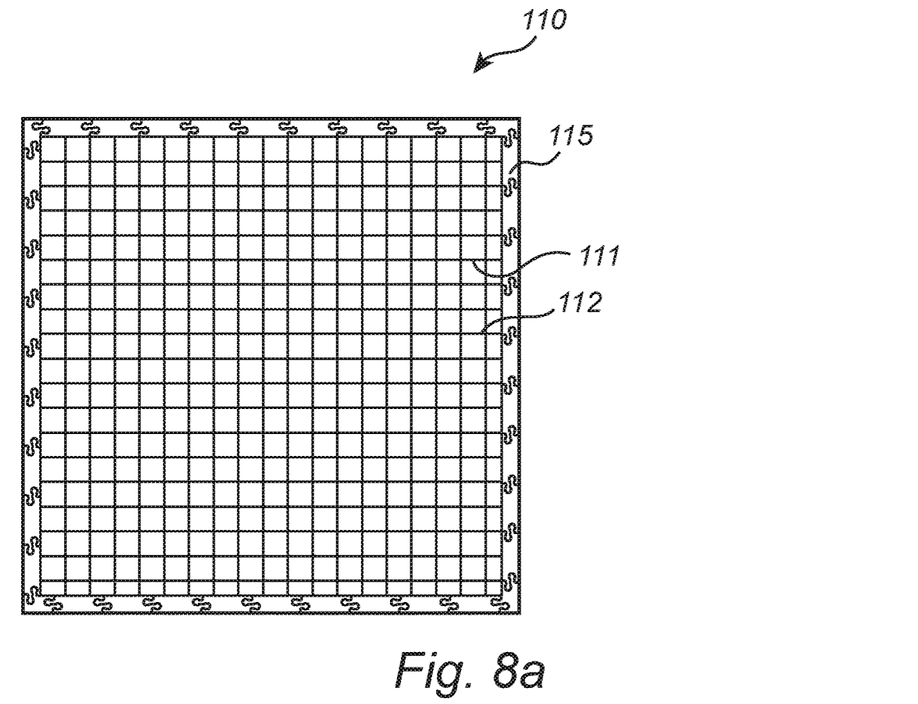
FIGS. 8a and b are top views of an electrode of a flow unit provided with a deformation structure according to embodiments of the invention.

FIG. 8a shows a deformation structure 115 of a grid acting as e.g. an emitter 110 in a flow unit 100 according to embodiments of the present invention. The grid comprises bridges 111 and joints 112 in accordance with the previously described embodiments. As indicated in FIG. 8a, the deformation structure 115 is composed of bridges 111 that are curved in a plane normal to the flow direction. The curved shape may e.g. be formed during manufacturing of the bridges 111, or induced by e.g. thermal stresses occurring during use of the flow unit 100. The curved shape may also comprise a weakened portion, e.g. a portion having a reduced gauge, so as to make it easier to deform upon heat induced stresses. As the material of the grid may expand with an increasing temperature, the bridges 111 of the deformation structure 126 may be compressed by compressive forces acting in the length direction of the bridges 111. By length direction should be understood the direction of extension between a first joint and a second joint. Thereby the lateral expansion of the grid may be absorbed by the deformation structure 115 and thermally induced stresses reduced so that the emitter 110 other than the deformation structure 115 may keep its original shape despite thermal expansion. It should however be understood that the forces acting on the bridges 111 of the deformation structure 115 also, or alternatively, may be caused by e.g. a torsional moment, or torque, acting on the structure.

Figure 8B:
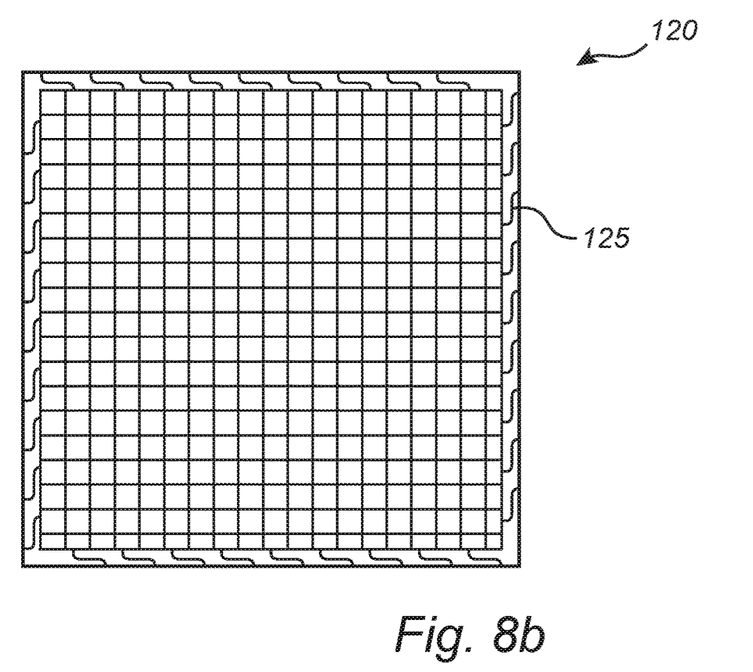

FIG. 8b shows a similar deformation structure 125 as described with reference to FIG. 8a, wherein the deformation structure 125 is formed of bridges 121 of a collector 120 of a flow unit 100 according to an embodiment. It will however be understood that the flow unit 100 may be provided with deformation structures 115, 125 arranged in any one, or several, of the emitter 110, the collector 120, and the support structure 130.

The deformation structure 115, 125 may be provided in an emitter 110 and/or collector 120 that is attached to a support structure 130, wherein in the support structure 130 may have a coefficient of thermal expansion (CTE) that differs from the CTE(s) of the emitter 110 and/or collector 120. In case the emitter 110 and/or collector 120 is/are rigidly attached to the support structure 130, the risk for deformations, such as e.g. bending and flexures, and damages such as fractures, disconnected or loosening joints etc. may be reduced by the deformation structure 115, 125. Thereby, reliability and useful life of the flow unit 100 may be increased.

Figure 9:
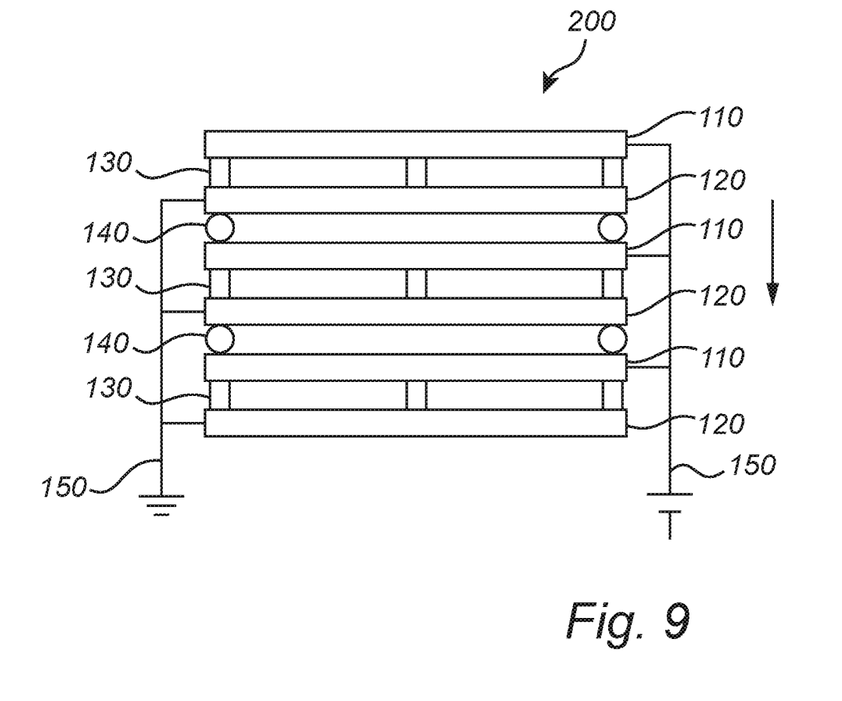
FIG. 9 is a cross section of a flow unit according to an embodiment.

FIG. 9 shows a cross section of flow unit 200 comprising a stacked structure of three first electrodes 110 and three second electrodes 210 according to any one of the previously described embodiments. The cross section is taken along the direction of the flow (indicated by an arrow in FIG. 6) and across a respective bridge 111, 121 of the grids of the electrodes 110, 120. A grid spacer 130 is arranged to separate the emitter 110 and the collector 120 electrodes from each other in the direction of the flow. According to this embodiment, the emitters 110 and collectors 120 may comprise e.g. Pt, Au, or stainless steel forming e.g. the bulk material or a surface coating.

The grid spacer 130 may e.g. be formed as a grid supporting the emitters 110 and the collectors 120. As illustrated in FIG. 9, the grid spacer 130 may comprise a peripheral frame of bridges to which the edge portions of the emitter 110 and the collector 120 are attached by e.g. welding, soldering or gluing. Alternatively, or additionally, the grid spacer 130 may comprise other spacing structures such as pillars or spacers, etc. The grid spacer 130 may also comprise one or several spacing members, such as e.g. additional bridges or pillars, supporting the centre portions of the emitter and collector. The grid spacer 130 may also comprise a deformation structure 115, 125 (not shown) similar to the deformation structure described with reference to FIGS. 8a and b.

The spacing d of the emitter and collector may be determined by the height of the bridges of the grid spacer 130, which may hence determine the magnitude of the electric field induced between the emitter 110 and the collector 120. The distance d between the emitter 110 and the collector 120 may e.g. be within the range of 10 μm and 1000 μm.

Further, the grid spacer 130 may comprise an alignment structure for facilitating alignment of the emitters 110 and the collectors 120, and/or alignment of the flow units 100 in the array.

As shown in FIG. 9, the emitter(s) 110 and the collector(s) 120 of a flow unit 200 may be connected to an external voltage supply by an electric connector or terminal 150. In this manner, an electric potential difference may be applied between the emitter 110 and collector 120 of the respective flow units 200. The electric potential difference may induce an electric field which may promote the electron emission and impart movement of the fluid between and through each of the emitter 110 and collector 120. Further, the electric connection 150 between the emitters 110 and/or collectors 120 and the external power supply may be provided by mechanical features and/or by electric contact portions 129 (not shown in FIG. 9). The mechanical features may e.g. be adapted so as to enable the electric connection to be formed by e.g. dispensing or screen printing, followed by e.g. sintering or welding. Advantageously, several or all of the flow units 200 can be connected in the same manufacturing step.

Figure 10A:
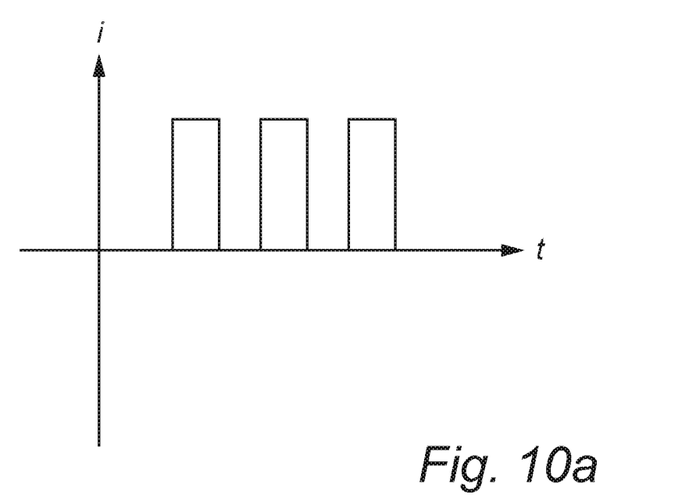
FIGS. 10a and b graphically illustrate electric current pulses applied to e.g. the emitter of a flow unit in accordance with an embodiment of the invention.
Figure 10B:
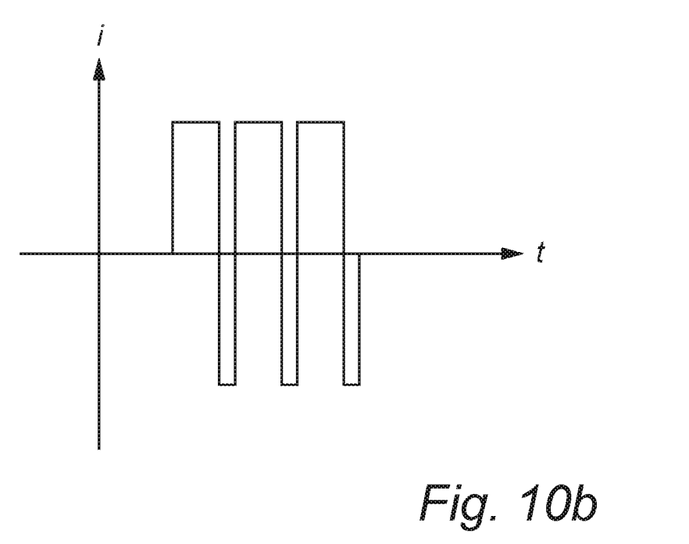

FIGS. 10a and b shows, as a function of time t, an electric current i provided to the emitter 110 of a flow unit 100 according to any one of the previous embodiments. In FIG. 10a, a positive current is applied and maintained for a first time period, and then removed. After a second time period the current supply is switched on again, thus forming a second pulse. Repeating this procedure can reduce the space charges that may be present in the fluid and may also allow any ionized particles to recombine.

To further improve relaxation, a pulse-reverse current may be introduced between the pulses described with reference to FIG. 10a. An example of such process is shown in FIG. 10b, wherein the positive pulses are separated by negative pulses. As shown in FIG. 10b, the negative pulses may have a larger absolute value than the positive pulses, but last for a shorter period of time so as to enable an overall positive flow. This procedure of separating the positive pulses by reverse pulses may advantageously improve relaxation, possibly to remove contaminants of the emitter 110 and/or collector 120.

The above described pulses may be applied simultaneously to several flow units 100 of the array 10, or selectively over time according to a predetermined schedule.

From a design point of view, it is an advantage to confine charged particles, such as e.g. ions, between a portion of a bridge 111 and/or joint 112 of the emitter 110 and a corresponding portion of a bridge 121 and/or joint 122 of the collector 120. Outside this volume, i.e. between the open portions of the respective grid, the charged ions may have a limited effect on the pumping action. The time duration of the positive pulses may be selected such that negatively charged ions, created at the emitter, may just reach the collector 120. Hence, if the time duration is sufficiently short, the spreading of unwanted ions into the liquid loop may be limited. This time length can be calculated from the ion mobility, where a range from $2\times10^{-8}$ to $2\times10^{-7}$ m$^2$/Vs is known form the prior art. For a pump having an electrode spacing of 100 µm, this may correspond to pulse duration of around 1 ms. The zero or negative pulse may advantageously be sufficiently long to allow recombination of ions or charged particles.

As outlined above, the method for controlling the flow of a fluid as illustrated by FIGS. 10a and 10b may be embodied as computer-executable instructions distributed and used in the form of a computer-program product including a computer-readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media (or non-transitory media) includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media (or transitory media) typically embodies computer readable instructions, data structures, program modules or other data in a modulated data signal such as a carrier wave or other transport mechanism and includes any information delivery media.

The invention claimed is:

1. An array of electrohydrodynamic flow units, comprising:
    a lid having a first opening;
    a housing attached to the lid to define a lateral plane between the housing and the lid, the housing having a second opening, wherein the lid and housing define a plurality of cells, and wherein the lid and housing define channels connecting the cells, such that a flow path from the first opening passing through the plurality of cells to the second opening is established;
    wherein an electrohydrodynamic flow unit is disposed in every other cell of the array, wherein each flow unit is adapted to control a respective flow of a fluid in a direction intersecting the lateral plane, each flow unit comprising:
        a first electrode comprising bridges and joints forming a grid structure, the first electrode being arranged to allow the fluid to flow through the first electrode; and
        a second electrode offset from the first electrode in a downstream direction of the flow of the fluid, the electrodes being connectable to a voltage source;
    wherein a downstream side of a first one the flow units is in fluid communication with an upstream side of a second one of the flow units so as to allow a flow of fluid to pass through said first and second one of the flow units.

2. An array of electrohydrodynamic flow units, comprising:
    a lid having a first opening;
    a housing attached to the lid to define a lateral plane between the housing and the lid, the housing having a second opening, wherein the lid and housing define a plurality of cells and wherein the lid and housing define channels connecting the cells, such that a flow path from the first opening passing through the plurality of cells to the second opening is established;
    wherein a predetermined number of cells of the plurality of cells each receive an electrohydrodynamic flow unit, provided that at least one cell of the plurality of cells does not contain a flow unit, wherein each flow unit is adapted to control a respective flow of a fluid in a direction intersecting the lateral plane, each flow unit comprising:
        a first electrode; and
        a second electrode offset from the first electrode in a downstream direction of the flow of the fluid, the electrodes being connectable to a voltage source, wherein:
            the first electrode comprises bridges and joints forming a grid structure, the first electrode being arranged to allow the fluid to flow through the first electrode,
            wherein at least one of the bridges has a maximum height in a direction parallel to a direction of the flow and a maximum gauge in a direction orthogonal to the direction of the flow, wherein said maximum height is larger than said maximum gauge, and
    wherein a downstream side of a first one the flow units is in fluid communication with an upstream side of a second one of the flow units so as to allow a flow of fluid to pass through said first and second one of the flow units.

3. The array according to claim 2, wherein at least one of the bridges has a first portion with a uniform cross section and a second portion that comprises a tapered portion having a cross section forming an edge and/or tip facing the second electrode.

4. The array according to claim 2, wherein said at least one of the bridges comprises a tapered portion having a cross section forming an edge and/or tip facing away from the second electrode.

5. The array according to claim 2, wherein:
    the second electrode comprises bridges and joints forming a grid structure, the second electrode being arranged to allow the fluid to flow through the second electrode, and wherein at least one of the bridges has a maximum height in a direction parallel to the direction of the flow and a maximum gauge in a direction orthogonal to the direction of the flow, wherein said maximum height is larger than said maximum gauge.

6. The array according to claim 5, wherein the second electrode comprises a surface portion facing the first electrode and being provided with microstructures that increase the area of the surface portion.

7. The array according to claim 5, wherein the second electrode comprises a concave surface portion facing the first electrode.

8. The array according to claim 5, wherein at least one of the bridges and/or joints of the second electrode comprise a channel adapted to allow the fluid to flow through said channel.

9. The array according to claim 2, wherein, for at least one of the fluid units, an open area of the first electrode is smaller than an open area of the second electrode.

10. The array according to claim 2, wherein, for at least one of the fluid units, an open area of the first electrode is larger than an open area of the second electrode.

11. The array according to claim 2, wherein, for at least one of the fluid units, an open area of the first and/or second electrode is formed of a sum of open areas of a plurality of through holes.

12. The array according to claim 11, wherein said plurality of through holes are arranged in a first surface distribution on the first electrode and a second surface distribution on the second electrode, said first and second distributions being different.

13. The array according to claim 2, wherein:
the second electrode is formed as a plate extending in a plane intersecting the direction of the flow of the fluid and comprising a through-hole adapted to allow the fluid to flow through the second electrode.

14. The array according to claim 2, wherein each flow unit further comprises a support structure separating the second electrode from the first electrode in the direction of the flow.

15. The array according to claim 14, wherein at least one of the first electrode, the second electrode, or the support structure comprises a deformation structure arranged to deform in a plane orthogonal to the direction of the flow to absorb thermally induced stress in at least one of the first electrode, the second electrode, or the support structure.

16. The array according to claim 2, wherein the downstream side of each flow unit is facing the same direction.

17. The array according to claim 2, wherein the downstream sides of two neighboring flow units are facing opposite directions.

18. The array according to claim 2, wherein at least one of the flow units comprises a stack of a plurality of first and/or second electrodes arranged above each other in the direction of the flow of the fluid.

19. A method for controlling the flow of a fluid through the array of electrohydrodynamic flow units according to claim 2, the method comprising:

providing a fluid contacting the first electrode of at least one of the flow units; and applying an electric potential difference between the first electrode and the second electrode of each flow unit, and varying the electric potential difference as a function of time.

20. An array of electrohydrodynamic flow units, comprising:
a lid having a first opening;
a housing attached to the lid to define a lateral plane between the housing and the lid, the housing having a second opening, wherein the lid and housing define a plurality of cells and wherein the lid and housing define channels connecting the cells, such that a flow path from the first opening passing through the plurality of cells to the second opening is established;
wherein a predetermined number of cells of the plurality of cells each receive an electrohydrodynamic flow unit, provided that at least one cell of the plurality of cells does not contain a flow unit, wherein each flow unit is adapted to control a respective flow of a fluid in a direction intersecting the lateral plane, each flow unit comprising:
a first electrode comprising bridges and joints forming a grid structure bounded by a deformation structure comprising bridges that are curved in the plane orthogonal to the direction of the flow, the first electrode being arranged to allow the fluid to flow through the first electrode; and
a second electrode offset from the first electrode in a downstream direction of the flow of the fluid, the electrodes being connectable to a voltage source;
wherein a downstream side of a first one the flow units is in fluid communication with an upstream side of a second one of the flow units so as to allow a flow of fluid to pass through said first and second one of the flow units.

* * * * *